United States Patent
Kuo et al.

(10) Patent No.: US 7,362,245 B2
(45) Date of Patent: Apr. 22, 2008

(54) VARIABLE LENGTH CODING METHOD FOR DATA COMPRESSION

(75) Inventors: Bey-Yun Kuo, Banciao (TW); Shi-Ho Tien, Hsinchu (TW)

(73) Assignee: Taiwan Imagingtek Corporation, Jhudong, Hsinohu (TW)

( * ) Notice: Subject to any disclaimer, the term of this patent is extended or adjusted under 35 U.S.C. 154(b) by 12 days.

(21) Appl. No.: 11/433,865

(22) Filed: May 15, 2006

(65) Prior Publication Data

US 2007/0262889 A1 Nov. 15, 2007

(51) Int. Cl.
*H03M 7/40* (2006.01)
(52) U.S. Cl. .................................................. 341/67
(58) Field of Classification Search ................ 341/67, 341/50; 382/244, 238
See application file for complete search history.

(56) References Cited

U.S. PATENT DOCUMENTS

| | | | |
|---|---|---|---|
| 3,750,104 A * | 7/1973 | Chang | 710/316 |
| 5,805,489 A * | 9/1998 | Fernando | 708/655 |
| 2007/0025630 A1* | 2/2007 | Sung et al. | 382/246 |
| 2007/0036445 A1* | 2/2007 | Lu et al. | 382/238 |

* cited by examiner

*Primary Examiner*—Brian Young

(57) ABSTRACT

The present invention provides method of a variable length coding for data compression. The first coding algorithm is applied to encode the data with the value less than half of the calculated divider and another coding algorithm encoding the subtracted value of the data. Another algorithm applies at least two predetermined "marker bits" to indicate the range of data with concatenated binary code encoding the shifted value of the data. Another algorithm deciding the boundary separating the first range and other ranges of the data and encode the data by applying at least two different algorithms accordingly.

15 Claims, 4 Drawing Sheets

| N Value | VLC Coding | K=3 (Divider=8) | Bits No. |
|---|---|---|---|
| 0~7 | 1XXX | XXX is Remainder | 4 bits |
| 8~15 | 01XXX | XXX is Remainder | 5 bits |
| 16~23 | 001XXX | XXX is Remainder | 6 bits |
| 24~31 | 0001XXX | XXX is Remainder | 7 bits |
| 32~39 | 00001XXX | XXX is Remainder | 8 bits |
| 40~47 | 000001XXX | XXX is Remainder | 9 bits |
| 48~55 | 0000001XXX | XXX is Remainder | 10 bits |
| 56~63 | 00000001XXX | Q=7 +"1", 3bits of R (XXX) | 12 bits |
| 64~71 | 000000001XXX | Q=8, "1", 3bits of R (XXX) | 13 bits |
| 72~79 | 0000000001XXX | Q=9, "1", 3bits of R (XXX) | 14 bits |
| 80~87 | 00000000001XXX | Q=10, "1", 3bits of R (XXX) | 15 bits |
| 88~95 | 000000000001XXX | Q=11, "1", 3bits of R (XXX) | 16 bits |
| >96 | 00000001zzzzzzzz | zzzzzzzz is N Value | 16 bits |

| Data (Pattern) | Fixed Code (8 bits Binary code) | A Variable Length Coding | Golomb-Rice Coding with "Divider=8" | Bit number Of the Golomb-Rice |
|---|---|---|---|---|
| 0 | 00000000 | 0 | 1000 | 4 |
| 1 | 00000001 | 10 | 1001 | 4 |
| 2 | 00000010 | 110 | 1010 | 4 |
| 3 | 00000011 | 1110 | 1011 | 4 |
| 4 | 00000100 | 11110 | 1100 | 5 |
| 5 | 00000101 | 111110 | 1101 | 5 |
| 6 | 00000110 | 1111110 | 1110 | 5 |
| 7 | 00000111 | 11111110 | 1111 | 5 |
| 8 | 00001000 | 111111110 | 01000 | 6 |
| 9 | 00001001 | 1111111110 | 01001 | 6 |
| ......... | | | | |
| 255 | 11111111 | 111......1110 | 000...0111 | 35 |

Fig. 1 (PRIOR ART)

| Pattern | Golomb-Rice Coding with K=3 (Divider=8) | New coding 1 Coding with K=3 (Divider=8) |
|---|---|---|
| 0 | 1000 | 100 |
| 1 | 1001 | 101 |
| 2 | 1010 | 110 |
| 3 | 1011 | 111 |
| 4 | 1100 | 01000 |
| 5 | 1101 | 01001 |
| 6 | 1110 | 01010 |
| 7 | 1111 | 01011 |
| 8 | 01000 | 01100 |
| 9 | 01001 | 01101 |
| 10 | 01010 | 01110 |
| 11 | 01011 | 01111 |
| 12 | 01100 | 001000 |
| 13 | 01101 | 001001 |
| 14 | 01110 | 001010 |
| 15 | 01111 | 001011 |
| 16 | 001000 | 001100 |
| ... | .... | .... |

Fig. 2

| N Value | VLC Coding | K=3 (Divider=8) | Bits No. |
|---|---|---|---|
| 0~7 | 1XXX | XXX is Remainder | 4 bits |
| 8 ~ 15 | 01XXX | XXX is Remainder | 5 bits |
| 16 ~ 23 | 001XXX | XXX is Remainder | 6 bits |
| 24 ~ 31 | 0001XXX | XXX is Remainder | 7 bits |
| 32 ~ 39 | 00001XXX | XXX is Remainder | 8 bits |
| 40 ~ 47 | 000001XXX | XXX is Remainder | 9 bits |
| 48 ~ 55 | 0000001XXX | XXX is Remainder | 10 bits |
| 56 ~ 63 | 000000001XXX | Q=7 +"1", 3bits of R (XXX) | 12 bits |
| 64 ~ 71 | 0000000001XXX | Q=8, "1", 3bits of R (XXX) | 13 bits |
| 72 ~ 79 | 00000000001XXX | Q=9, "1", 3bits of R (XXX) | 14 bits |
| 80 ~ 87 | 000000000001XXX | Q=10, "1", 3bits of R (XXX) | 15 bits |
| 88 ~ 95 | 0000000000001XXX | Q=11, "1", 3bits of R (XXX) | 16 bits |
| >96 | 00000001zzzzzzzz | zzzzzzzz is N Value | 16 bits |

Fig. 3

| N value (K=1) | New VLC+TITC Coding Method (Code 1) Coding "Quotient" + "Marker" +"Remainder" | Coding Length |
|---|---|---|
| 0 ~ 5 | | 2 ~ 4 bits |
| 6 ~ 9 | "000" + "0"    + (N-6) / 2 bits | 6 bits |
| 10 ~ 13 | "000" + "10"   + (N-10) / 2 bits | 7 bits |
| 14 ~ 45 | "000" + "110" + (N-14) / 5 bits | 11 bits |
| 46 ~ 255 | "000" + "111" + (N) / 8 bits | 14 bits |

Fig. 4

| N value (K=1) | New VLC+TITC Coding Method (Code 2) | Coding Length |
|---|---|---|
| 0 ~ 8 | Coding "Quotient" + "Marker" + "Remainder" | 2 ~ 6 bits |
| 9 ~ 12 | "0000" + "0" + (J2P-9) / 2 bits | 7 bits |
| 13 ~ 20 | "0000" + "10" + (J2P-13) / 3 bits | 9 bits |
| 21 ~ 52 | "0000" + "110" + (J2P-21) / 5 bits | 12 bits |
| 53 ~ 255 | "0000" + "111" + (J2P) / 8 bits | 15 bits |

Fig. 5

| N Value (K=3, M=8) | New VLC+TITC Coding Method | Coding Length |
|---|---|---|
| 0 ~ 23 | Coding "Quotient" + "Marker" + "Remainder" | 4 ~ 6 bits |
| 24 ~ 39 | "000" + "0" + (J2P-24) / 4 bits | 8 bits |
| 40 ~ 55 | "000" + "10" + (J2P-40) / 4 bits | 9 bits |
| 56 ~ 87 | "000" + "110" + (J2P-56) / 5 bits | 11 bits |
| 88 ~ 255 | "000" + "111" + (J2P) / 8 bits | 14 bits |

Fig. 6

VARIABLE LENGTH CODING METHOD FOR DATA COMPRESSION

BACKGROUND OF THE INVENTION

1. Field of Invention

The present invention relates to the variable length coding method, more specifically to an efficient coding method that results in shorter code length of representing a data stream.

2. Description of Related Art

Digital audio, image and video have been adopted in an increasing number of applications, which include video telephony, videoconferencing, surveillance system, VCD (Video CD), DVD, and digital TV. In the past almost decades, ISO and ITU have separately or jointly developed and defined some digital video compression standards including MPEG-1, MPEG-2, MPEG-4, MPEG-7, H.261, H.263 and H.264. The success of development of the compression standards fuels wide applications. The advantage of digital image and video compression techniques significantly saves the storage space and transmission time without sacrificing much of the image quality.

One of the main driving sources for the success of the digital audio, image and video compression technology is the data compression algorithms including some alternatives like Huffman coding, arithmetic coding in image and video compression. These coding algorithm reach higher coding efficiency when combining with DCT, Discrete Cosine Transform and quantization which has higher probability of continuous "0s" or/and "no more non-zero" (assigning a code of "EOB, End-Of-Block"). Some other coding algorithms including fixed bit binary coding and variable length coding like Golomb-Rice coding have individual disadvantage and can not reach higher data reduction rate.

This invention of a variable length coding for data compression helps more efficiently reducing the data rate, especially for a group of data.

SUMMARY OF THE INVENTION

The present invention is related to a method of the variable length coding, which plays an important role in representing the value of a data. The present invention reduces the bit rate in average compared to its counterparts in the field of representing the digital audio, image and video stream.

The present invention of the efficient variable length coding separates a each group of data to be two sub-groups with the $1^{st}$ half using shorter code and the $2^{nd}$ half using longer code to represent.

According to one embodiment of present invention, a continuous 7 "0" followed by a "1" are used as a breaker to be followed by the original binary code of data representation.

According to another embodiment of the present invention, a certain amount of continuous "0s" or "1s" are use as a "Breaker" followed by variable length code to separate the "ranges" of data and using binary codes to represent the data value subtracted from previous range of data value.

According to another embodiment of the present invention, the $1^{st}$ part of before applying the "Breaker" and the binary code is coded by the $1^{st}$ invention of using shorter code to represent the $1^{st}$ half of a group of data and longer value to represent the $2^{nd}$ half of a group of data.

According to another embodiment of the present invention, a code is assigned inserted into a group of data to represent the border separating the groups of data with the $1^{st}$ group using a coding method, the rest of groups using another coding method.

According to another embodiment of the present invention, a code is assigned inserted into a group of data to represent the border separating each group of data according to the probability distribution of the data to be coded.

It is to be understood that both the foregoing general description and the following detailed description are by examples, and are intended to provide further explanation of the invention as claimed.

BRIEF DESCRIPTION OF THE DRAWINGS

FIG. 1 shows two prior art variable length coding including the Golomb-Rice coding.

FIG. 2 illustrates the comparison of the Golomb-Rice coding and part of this invention with shorter code with divider equals to 8.

FIG. 3 illustrates another part of this invention with stopper code in limiting the longest code of worst case.

FIG. 4 illustrates another new part of this invention with "Marker" code in separating each "Range" and the coding the shifted "Value".

FIG. 5 depicts another part of this invention with "Marker" code of shifted "Range" with divider equals "1".

FIG. 6 depicts another part of this invention with values within the $1^{st}$ "Marked" range using TITC-1 coding method.

DESCRIPTION OF THE PREFERRED EMBODIMENTS

Figure 7:
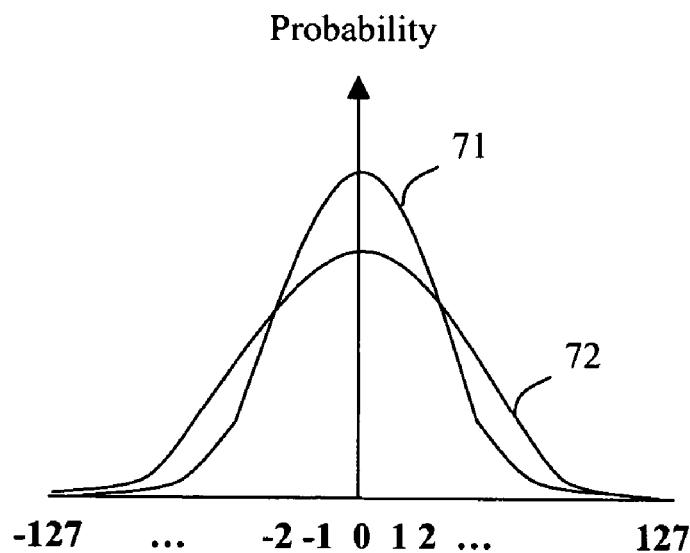
FIG. 7 illustrates the probability curves of a group of data

Data compression has advantages of less density requirement of storage device, higher speed in data accessing, less power consumption in keeping the data and cost reduction. For instance, an uncompressed image of 1 million pixels with 8 bits for Red, Green and Blue color components requires a total of 24M bits. Applying compression technique can reduce the data amount from 24M bits down to 2M bits with 12 times compression by JPEG compression algorithm or down to 10 bits with 2.4 times compression rate by the JPEG-LS (lossless JPEG).

JPEG is a lossy compression algorithm which after decompression, even might not easily tell the difference, the reconstructed image no longer the same pixel value compared to the uncompressed image. Some coding algorithms are lossless resulting in less compression rate with 100% same data compared to the uncompressed data.

The present invention relates specifically to the lossless data compression with a variable length coding method. This invention of variable length coding represents the data and even more efficient in representing a group of data.

FIG. 1 lists two prior art of data representation and two lossless data compression algorithms. The original data (or pattern), for example, data with continuous value increase from 0 to 255 are listed in the $1^{st}$ column 11. The $2^{nd}$ column lists a well know fixed 8 bits binary code 12 from "0=00000000, 1=00000001, 2=00000010 . . . to 255=11111111". The $3^{rd}$ column lists a simple variable length coding 13 with shortest code of "0" representing 0, "1=10, 2=110, 3=1110, 4=11110 . . . etc." The $4^{th}$ Column shows an efficient coding invented by two men called Golomb and Rice and this method is commonly called "Golomb-Rice Coding" 14. A Golomb-Rice coding divides the data by a predetermined value of divider, for example, divider=8, and codes the "Quotient" and "Remainder" by inserting a marker ("0" or "1" just opposite to the selected representative of "Quotient", if continuous "0s" are select to represent "quotient", the marker should be "1"). Mr. Golomb invented the first part of this lossless data compression coding method by encoding the "Quotient" and "Remainder", Mr. Rice modified it by limiting the divider value to the power of "2", for example, 1, 2, 4, 8, 16 . . . with the power becoming 0, 1, 2, 3, 4 . . . representing the bit number of the "Remainder" which makes the calculation and coding much simple than a nature number as the divider. An example of data ranging from 0 to 255 are illustrated in column 4 with the divider equals to 8 (power value of K=3), the remainders are binary code and limited to be 3 bits, the marker 15 is predetermined to be "1" separating the "Quotient" and "Remainder". In Golomb-Rice coding, the "Remainder" is always binary code, while the "Quotient" is continuous number of either "0s" or "1s" which are different from the marker. For instance, if a data of 47 divided by 8 (K=3), the Remainder=7 and Quotient=5, and the code will be 5 "0s" with "1" as marker and binary code of 7="111" and the final code if "000001111". Column 5 lists the bit number of using divider=8 with ranging from 0-255 which code ranges from 4 bits to 35 bits. Even Golomb-Rice is a nice coding algorithm, there are still some data costs high bit numbers to represent. This invention of lossless variable length coding method provides shorter code in representing a data within smaller range and much shorter code in presenting a data within larger range.

FIG. 2 shows a table listing the data to be codec 21 and prior art Golomb-Rice coding 22 with the divider implicitly equals to 8, and part of this invention 23. As shown in the corresponding columns, the data of 0 to 7 in Golomb-Rice code ranges from "1000, 1001, 1010 . . . " to "1111" and the data of 8 to 15 add an additional "0" to the front of code of data 0 to 7, "01000, 01001, 01010 . . . " It is obvious that the code of data 0 to 3 has one "0" between the marker bit "1" and the two bits binary code. Part of this invention takes advantage of applying shorter code with no need of the extra "0" in between the marker bit of "1" and the binary code in the first range of data, in this example is data within 0 to 3. Theoretically, this new method codes the first range of data, said N, with N<half of divider, by coding the marker bit followed by binary code of the value of the data. In this example, data ranging from 0 to 3 (divider equals to 8) is less than half of the divider and is assigned code of "0=100", "1=101", "2=110" and "3=111". And the data range beyond half of the divider is shifter by adding half of the divider, for example, data=4 will be shifted to be 8, and being coded by encoding the "Quotient" and "Remainder" with a marker bit inserted to separate the quotient and remainder. Therefore, the data=4 will be coded as if it is 8 and the code will be "01000", the data=5 will be coded like 9 and the code becomes "01001" . . . Data=11 will be coded as "01111" and data=12 is coded as "001000" . . . etc.

FIG. 3 shows another part of this invention of lossless variable length coding method. Due to the fact that when data is within the range of larger number, the code might be quite long, this invention limits the code to a predetermined length, said 16 bits by applying continuous bits, for example, "0000000" followed by the original data 31 with binary code with a marker bit inserted in between. In an example coding shown in column 2 of FIG. 3, the data 0~7 will be coded by no quotient following by a marker bit of "1" and 3 bits binary code "XXX". Data 16~23 will be coded as "001XXX" with XXX representing the binary code of the remainder. Data 24-31 will be coded as "0001XXX", 32-39 will be coded as "00001XXX", 40-47 will be coded as "00001XXX" a total of 8 bits which code length is equivalent to the binary code length of the original data. Since "0000000" is preserved pattern for original data coding, the data of 48-55 will be coded as "0000001XXX", 56-63 will be coded as "00000001XXX", 64-71 will be coded as "000000001XXX", 72-79 will be coded as "0000000001XXX", 80-87 will be coded as "0000000001XXX", 88-95 will be coded as "0000000001XXX", a total of 15 bits. It is shown that beyond 48, the code needs an extra bit of "0" compared to the length of "Golomb-Rice coding with the benefit of limiting the longest code to be 16 bits in this part of invention. The $4^{th}$ column lists the bit number 34 of each data and the $3^{rd}$ column explains the way 33 of this method of variable length coding.

FIG. 4 shows another part of this invention of the variable length coding with divider equals to 2 (K=1). The data ranging from 0 to 5 uses the first part of this invention of a variable length coding as described in previous two paragraphs and FIG. 3 which codes the "Quotient" and "Remainder" with inserted market bit. Coding the next range of data starts by inserting a marker 43, for example "000" to distinguish them from the $1^{st}$ range of 0-5 since it requires code with length ranging from 2 (0=10) to 4 bits (5=0011) with no more than 2"0s". The $2^{nd}$ range 46 of data has four numbers, 6, 7, 8, 9 which subtract 6 becomes 0, 1, 2, 3 and can be coded by two bits of binary code. So, the code to represent the values of 6, 7, 8 and 9 become "000 0 00", "000 0 01", "000 0 10" and "000 0 11". The $3^{rd}$ range 47 of data has four numbers, 10, 11, 12, 13 which subtract 10 becomes 0, 1, 2, 3 and can be coded by two bits of binary code. So, the code to represent the values of 10, 11, 12 and 13 become "000 10 00", "000 10 01", "000 10 10" and "000 10 11". The $4^{th}$ range 48 of data includes 32 numbers, 14~45 which subtracted from 14 becomes 0~31 and can be coded by five bits of binary code. So, the code to represent the values of 6, 7, 8 and 9 become "000 0 00", "000 110 0001", "000 110 0010", "000 110 0011" . . . till "000 110 1111". The last range 49 of data includes 210 numbers, 46~255 and can be coded by inserting 3 marker bits, "000" and "111" range separating bits followed by 8 bits binary code turning out to be a total of 14 bits. Some alternatives derived from this new method of variable length coding might apply to variable groups of data with variable pattern distribution which gain different total bit numbers.

FIG. 5 shows another example of a variance from this method which includes different ranges of data 51 value with each range having variable numbers of data amount and variable length of needed binary code to represent. In this example of data coding with divider=2 (K=1), the $1^{st}$ range of data includes values 0~7, using the $1^{st}$ method of encoding this range of data results in coding length of 2~5 bits comprising (quotient+marker+remainder) together. In the $2^{nd}$ range with data value varies from 8 to 11, applying another method of this invention as described in above paragraph results in code length of 7 bits which comes from 3 bits of marker "0000", 1 bit "0" to separate this range from next ranges and 2 bits of binary code to represent the value subtracts 8. The $3^{rd}$ range includes data value 12~19, which in binary coding needs 3 bits and results in a total of 9 bits with 3 bits marker "0000", 2 bits of "10" separating this range from next ranges and 3 bits of binary code. The $4^{th}$ range includes data value 20-51, applying this invention results in a total of 12 bits with 4 bits marker "0000", 3 bits of "110" separating this range from next ranges and bits of binary code. The rest data will be coded by a total of 15 bits including 4 bits marker "000", 3 bits "111" representing this range and 8 bits of binary code. Column two 52 lists the explanation of this new method of variable coding. Column three 53 shows the bit number to represent individual ranges of data.

When the data values are higher, the code length will increase sharply, and the easiest way to minimize the code length is to apply larger value of divider, for example, the divider=8 (K=3) as shown in FIG. 6. The $1^{st}$ range of data includes 0~23 which are coded by coding the quotient and remainder with a marker bit in between. The $2^{nd}$ range of data include 24~39 and are coded starting by 3 bits "000" marker to separate from the $1^{st}$ range and followed by a "0" to represent the range, and followed by the 4 bits binary code. The $3^{rd}$ range of data include 40~55 and are coded starting by 3 bits "000" marker to separate from the $1^{st}$ range and followed by "10" to represent the range, and followed by the 4 bits binary code. The $4^{th}$ range of data include 56-87 and are coded starting by 3 bits "000" marker to separate from the $1^{st}$ range and followed by "110" to represent the range, and followed by the 5 bits binary code. The rest of data ranging from 88 to 255 are coded starting by 3 bits "000" marker to separate from the $1^{st}$ range and followed by a "111" to represent the range, and followed by the 8 bits binary code.

This invention of variable length coding of data compression combines the $1^{st}$ part of coding method as described in FIG. 2 and the $2^{nd}$ part of the coding method of dividing the data into a several groups and code only the subtracted value be identifying which range of group firstly. The $1^{st}$ range data is coded by the part 1 of this invention which if data said, N<half of divider, encodes a marker bit followed by binary code of the value of the data otherwise, encodes the N by adding half of the divider to N and code the quotient and remainder with a marker bit inserted in between. A group of data can be calculated the probability and the distribution as shown in FIG. 7 the higher the probability 71 in "0", and +1/−1, when applying the $1^{st}$ method of this invention, the code efficiency will be higher. When the probability of "0", +1/−1 becomes lower 72, the $1^{st}$ range of data can be narrowed to let other range of data use more bits to represent. Calculated probability of data pattern can be applied to determine the boundaries of ranges of data and to optimize the code efficiency.

Figure 8:
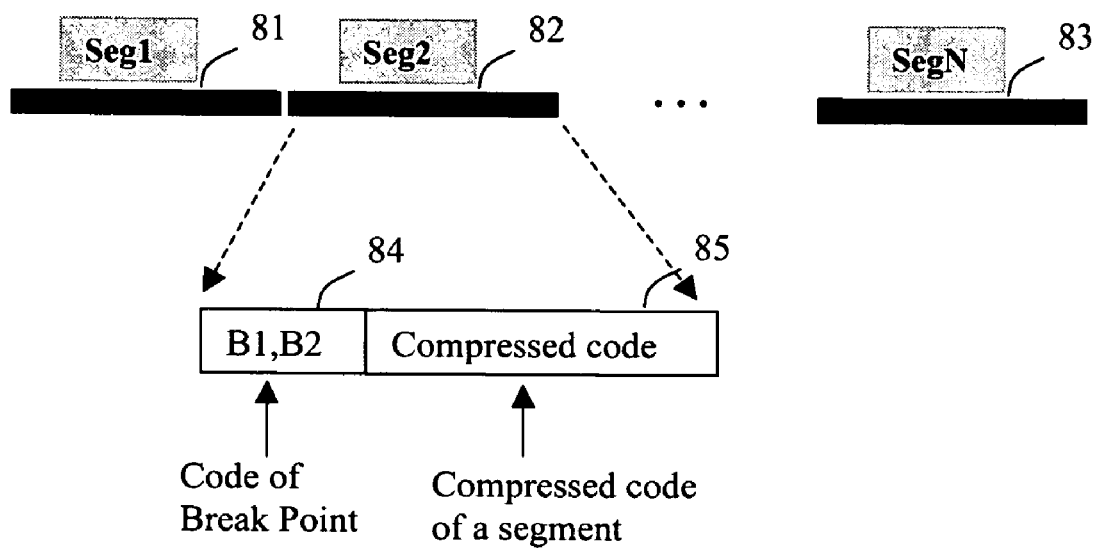
FIG. 8 shows the coding method of a group or names "segment" of samples with this invention of variable length coding.

It is obvious that deriving from this invention, one can easily improve the coding efficiency in variable group of data patterns. For example, in the coding method shown in FIG. 6, the last range, 88~255 can be shifted to be 128~255 and will require only 7 bits of binary code to represent the data value after subtracting from 128 and saving 1 bit in coding the data in this range. The $1^{st}$ range of 0~23 can be extended to 0~31 or 0~55 if this kind of extension in the $1^{st}$ range helps in reducing the total bit number of encoding a group of data. Also, the boundary of range 2, range 3 to range 4 can be adjusted according to the probability of data number. For instance, a line of pixels is partitioned to be a several segments 81, 82, 83 of pixels as shown in FIG. 8, since different boundary will result in different code length, the code length to represent each segment of pixels with various boundaries are calculated. Several bits 84 can be inserted into the bit stream to represent the boundary of ranges of the group of data and followed by the compressed data stream 85.

It will be apparent to those skills in the art that various modifications and variations can be made to the structure of the present invention without departing from the scope or the spirit of the invention. In the view of the foregoing, it is intended that the present invention cover modifications and variations of this invention provided they fall within the scope of the following claims and their equivalents.

What is claimed is:

1. A coding method of representing a number, so named N, comprising:
   calculating the value of the divider with weighted factors, so named M and saving it into a temporary storage device for coding the data;
   determining which coding algorithm to best fit into the number to be coded;
   separating the N into two groups and applying the determined coding algorithm to encode N according to the following procedure:
   if N<M/2, coding a "marker bit" concatenated with the binary code of "N",
   otherwise, dividing the [N+(M/2)] by M, then, coding the "Quotient" and "Remainder" with a marker bit in between.

2. The method of claim 1, wherein when compressing a targeted data by dividing the data by a predetermined divider, if the code length of the quotient is longer than a predetermined number, a marker bit is inserted followed by the binary code representing the value of the targeted data.

3. The method of claim 2, wherein at least 1 additional bit can be expended to the predetermined length of the quotient to represent other ranges of data which is beyond the original data range.

4. The method of claim 1, wherein when N is less than M/2, there is no need to quote the quotient and the remainder is the binary code with the same length of the divider.

5. The method of claim 1, wherein in encoding the value of the quotient, the amount of continuous "0s" or "1s" representing the value of quotient is encoded, followed by the contradictory pole of a marker bit to separate the quotient from the remainder.

6. The method of claim 1, wherein the calculated divider with weighted divider is applied to encode the data by coding only the quotient and remainder with the divider calculated by a hardware calculator and being saved into a temporary storage device.

7. The method of claim 6, wherein the later the data the higher weighted factor will be in calculating the divider value.

8. The method of claim 1, wherein the divider is the value of a power of 2.

9. A method for encoding a group of data, comprising:
   calculating the bit numbers needed for encoding the group of data with variable boundaries separating data into at least two groups;
   applying at least one bit of data to indicate the boundaries separating the groups of data to be coded; and
   if the data to be coded is within the predetermined first range, then encoding it by applying the first coding algorithm which divides the data by a divider and encodes it with a shorter "Remainder" if the data is less than a half of the divider, otherwise, adding value of half of divider into the data and encoding it with quotient and remain with a marker bit in between;

if the data to be coded is not within the predetermined first range, then encoding it by the following:

firstly inserting at least two bits "marker";

followed by variable length codes to separate the ranges of data value; and applying binary code to encode the subtracted value of the individual data value.

10. The method of claim 9, wherein at least two bits of marker are applied to separate the first range of data from others.

11. The method of claim 9, wherein calculating required bit number of code with variable boundaries separating the first range data from others, and using this bit numbers as reference in determining the boundary.

12. The method of claim 9, wherein referring to the data values of other than the first range of groups of data and determining the number of the variable marker bits which separates the groups of ranges other than the first range.

13. The method of claim 9, wherein referring to the data values of other groups of data and determining the number of the group of data to be clustered into a group in using binary code to encode the values.

14. The method of claim 9, wherein the boundary is determined by the calculated probability distribution of the data to be coded.

15. The method of claim 9, wherein a group of data is a segment of differential values of neighboring pixels with predetermined amount of image pixels within a segment.

* * * * *